United States Patent
Cho

(10) Patent No.: US 11,418,178 B2
(45) Date of Patent: Aug. 16, 2022

(54) ANALOG BEAMFORMER

(71) Applicant: SAMSUNG MEDISON CO., LTD., Hongcheon-gun (KR)

(72) Inventor: Seungwoo Cho, Seongnam-si (KR)

(73) Assignee: SAMSUNG MEDISON CO., LTD., Hongcheon-gun (KR)

( * ) Notice: Subject to any disclaimer, the term of this patent is extended or adjusted under 35 U.S.C. 154(b) by 241 days.

(21) Appl. No.: 16/786,432

(22) Filed: Feb. 10, 2020

(65) Prior Publication Data

US 2020/0266807 A1 Aug. 20, 2020

(30) Foreign Application Priority Data

Feb. 18, 2019 (KR) .......................... 10-2019-0018807

(51) Int. Cl.
  *H03K 5/13* (2014.01)
  *G01S 7/03* (2006.01)
  *G01S 7/52* (2006.01)

(52) U.S. Cl.
  CPC .............. *H03K 5/13* (2013.01); *G01S 7/032* (2013.01); *G01S 7/52019* (2013.01)

(58) Field of Classification Search
  CPC .......... H04B 7/02; H04B 7/04; H04B 7/0408; H04B 7/0617; H04B 7/0671; H04B 7/086; H03K 5/13; G01S 7/032; G01S 7/52019; G01S 7/52079; G01S 7/52085;
  (Continued)

(56) References Cited

U.S. PATENT DOCUMENTS 4,241,451 A * 12/1980 Maixner ................... H03D 1/24
  329/308
4,679,176 A * 7/1987 Ogawa ................. G10K 11/346
  367/103

(Continued)

FOREIGN PATENT DOCUMENTS

| JP | 2010-115364 A | 5/2010 |
| KR | 10-2014-0058460 A | 5/2014 |
| KR | 10-2018-0005930 A | 1/2018 |

OTHER PUBLICATIONS

Zili Yu et al., "A Programmable Analog Delay Line for Micro-Beamforming in a Transesophageal Ultrasound Probe", IEEE, 2010, 3 pages.

(Continued)

*Primary Examiner* — Peter M Bythrow
(74) *Attorney, Agent, or Firm* — Sughrue Mion, PLLC

(57) ABSTRACT

An analog beamformer includes: an input circuit configured to receive an input signal to generate a first input signal having the same phase as the input signal and a second input signal having a phase difference corresponding to a first phase with respect to the input signal; a first delay circuit configured to delay the first input signal to output a first delayed signal; a second delay circuit configured to delay the second input signal to output a second delayed signal; and an output circuit configured to output an output signal by summing the first delayed signal and the second delayed signal, wherein a first write signal has the phase difference corresponding to the first phase with respect to a second write signal, and a first read signal has the phase difference corresponding to the first phase with respect to a second read signal.

12 Claims, 13 Drawing Sheets

(58) Field of Classification Search
CPC ............... G01S 7/5209; G01S 7/52092; G01S 7/52095; G01S 11/14; G01S 13/931
See application file for complete search history.

(56) References Cited

U.S. PATENT DOCUMENTS

| | | | | |
|---|---|---|---|---|
| 4,841,491 | A * | 6/1989 | Kondo | G10K 11/346 367/103 |
| 5,172,343 | A * | 12/1992 | O'Donnell | G01N 29/0645 367/103 |
| 5,233,993 | A * | 8/1993 | Kawano | G01N 29/0609 600/443 |
| 5,544,128 | A * | 8/1996 | Kim | G01S 7/52095 367/103 |
| 5,685,308 | A * | 11/1997 | Wright | G01S 7/52023 600/443 |
| 5,921,932 | A * | 7/1999 | Wright | G10K 11/346 600/447 |
| 6,117,085 | A * | 9/2000 | Picatti | A61B 8/56 600/459 |
| 6,248,073 | B1 * | 6/2001 | Gilbert | A61B 8/463 600/443 |
| 6,500,120 | B1 * | 12/2002 | Anthony | G01S 7/5208 600/437 |
| 8,312,771 | B2 * | 11/2012 | Randall | A61B 8/56 73/627 |
| 9,297,890 | B2 * | 3/2016 | Lee | G01S 15/8979 |
| 2002/0045830 | A1 * | 4/2002 | Powers | G01S 7/52025 600/459 |
| 2002/0082500 | A1 * | 6/2002 | Henderson | G10K 11/346 600/443 |
| 2006/0077445 | A1 | 4/2006 | Yamamura et al. | |
| 2006/0079784 | A1 | 4/2006 | Shifrin | |
| 2007/0016022 | A1 * | 1/2007 | Blalock | G01S 7/5208 600/437 |
| 2007/0229336 | A1 * | 10/2007 | Liu | G01S 7/52034 341/143 |
| 2009/0018443 | A1 * | 1/2009 | Colby | G01S 7/52023 600/437 |
| 2013/0077445 | A1 * | 3/2013 | Um | G10K 11/346 367/135 |
| 2015/0297193 | A1 * | 10/2015 | Rothberg | A61B 8/4483 600/459 |
| 2017/0227630 | A1 * | 8/2017 | Bagge | G01S 15/8915 |
| 2018/0003810 | A1 * | 1/2018 | Freeman | G01S 15/8915 |
| 2018/0003811 | A1 * | 1/2018 | Pellegretti | G01S 15/8918 |
| 2018/0003819 | A1 * | 1/2018 | Koptenko | G01S 15/8927 |
| 2018/0008234 | A1 * | 1/2018 | Kim | A61B 8/4494 |
| 2018/0064418 | A1 * | 3/2018 | Savord | G01S 15/8925 |
| 2018/0064419 | A1 * | 3/2018 | Savord | G10K 11/341 |
| 2018/0203103 | A1 * | 7/2018 | Pellegretti | G01S 7/52028 |
| 2019/0072657 | A1 * | 3/2019 | Delos | G01S 7/032 |
| 2019/0170870 | A1 * | 6/2019 | Marsch | G01S 13/34 |
| 2019/0227165 | A1 * | 7/2019 | Savord | G01S 7/5208 |
| 2019/0247019 | A1 * | 8/2019 | Savord | G01S 7/5208 |
| 2020/0182989 | A1 * | 6/2020 | Freeman | G01S 7/52095 |
| 2021/0293952 | A1 * | 9/2021 | Haque | G01S 15/8927 |

OTHER PUBLICATIONS

Communication dated Jul. 15, 2020 by the European patent Office in counterpart European Patent Application No. 20153658.8.

* cited by examiner

ANALOG BEAMFORMER

CROSS-REFERENCE TO RELATED APPLICATION(S)

This application is based on and claims priority under 35 U.S.C. § 119 to Korean Patent Application No. 10-2019-0018807, filed on Feb. 18, 2019, in the Korean Intellectual Property Office, the disclosure of which is incorporated by reference herein in its entirety.

BACKGROUND

1. Field

The disclosure relates to analog beamformers.

2. Description of Related Art

An analog beamformer is a circuit for adjusting timing of a set of analog signals by adjusting a delay time for each of the analog signals. Analog beamformers have been used in various electronic devices employing a set of analog signals. Although an analog beamformer basically uses an input signal and a clock signal, unwanted frequency components may be contained in an output signal due to interference between the input and clock signals. The unwanted frequency components in the output signal may decrease a signal-to-noise ratio (SNR) of the output signal and thus degrade the quality thereof. Furthermore, the unwanted frequency components may adversely affect data components and thereby cause signal distortion.

Ultrasound imaging apparatuses transmit ultrasound signals generated by transducers of a probe to an object and receive information about signals reflected from the object, thereby obtaining at least one image of an internal part, for example, soft tissue or blood flow, of the object. Ultrasound imaging apparatuses process analog signals generated by a probe to obtain an ultrasound image, and include an analog beamformer for performing beamforming on the generated analog signals.

SUMMARY

Provided are analog beamformers for reducing unwanted signal components in their output signals.

Also provided are analog beamformers for reducing down-mixing components in their output signals.

Additional aspects will be set forth in part in the description which follows and, in part, will be apparent from the description, or may be learned by practice of the presented embodiments.

In accordance with an aspect of the disclosure, an analog beamformer includes: an input circuit configured to receive an input signal to generate a first input signal having the same phase as the input signal and a second input signal having a phase difference corresponding to a first phase with respect to the input signal; a first delay circuit configured to receive the first input signal and delay the first input signal by a beamforming delay time to output a first delayed signal; a second delay circuit configured to receive the second input signal and delay the second input signal by the beamforming delay time to output a second delayed signal; and an output circuit configured to output an output signal by summing the first delayed signal and the second delayed signal. In the analog beamformer, a first write signal controlling an input of the first delay circuit has the phase difference corresponding to the first phase with respect to a second write signal controlling an input of the second delay circuit, and a first read signal controlling an output of the first delay circuit has the phase difference corresponding to the first phase with respect to a second read signal controlling an output of the second delay circuit.

The first phase may correspond to 90 degrees.

The input circuit may be further configured to perform orthogonal transformation on the input signal, and the first input signal may be orthogonal to the second input signal.

The first delay circuit may be further configured to hold the first input signal in response to the first write signal and output the first delayed signal in response to the first read signal that is delayed by the beamforming delay time with respect to the first write signal, and the second delay circuit may be further configured to hold the second input signal in response to the second write signal and output the second delayed signal in response to the second read signal that is delayed by the beamforming delay time with respect to the second write signal. The second write signal may have the phase difference corresponding to the first phase with respect to the first write signal, and the second read signal may have the phase difference corresponding to the first phase with respect to the first read signal.

The analog beamformer may further include: a write signal generating circuit configured to generate the first write signal and the second write signal by performing orthogonal transformation on an original write signal; and a read signal generating circuit configured to generate the first read signal and the second read signal by performing orthogonal transformation on an original read signal.

The first delay circuit may include a plurality of first delay cells, each of which includes: a first write switch that is turned on in response to the first write signal and transmits the first input signal; a first capacitor storing the first input signal transmitted via the first write switch; and a first output switch that is turned on in response to the first read signal and outputs the first delayed signal from the first capacitor. The second delay circuit may include a plurality of second delay cells, each of which includes: a second write switch that is turned on in response to the second write signal and transmits the second input signal; a second capacitor storing the second input signal transmitted via the second write switch; and a second output switch that is turned on in response to the second read signal and outputs the second delayed signal from the second capacitor.

The first write signal may include a plurality of pulses respectively corresponding to the plurality of first delay cells, and the first read signal may include a plurality of pulses respectively corresponding to the plurality of first delay cells. The second write signal may include a plurality of pulses respectively corresponding to the plurality of second delay cells, and the second read signal may include a plurality of pulses respectively corresponding to the plurality of second delay cells.

Each of the first and second write signals may have a first clock frequency, and the output signal may include an up-mixing component having a frequency corresponding to a sum of an input frequency of the input signal and the first clock frequency and a down-mixing component having a frequency corresponding to a difference between the input frequency and the first clock frequency.

An intensity of the down-mixing component may be less than or equal to ten (10) percent of an intensity of the up-mixing component.

The analog beamformer may perform beamforming on an analog signal output from an ultrasound probe, and the input signal may include a plurality of signals output from a plurality of elements of a transducer in the ultrasound probe.

The analog beamformer may perform beamforming on an analog signal detected by a radar, and the input signal may include a plurality of signals output from a plurality of detecting elements of the radar.

The radar may be installed on a car to detect objects in the car's surroundings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
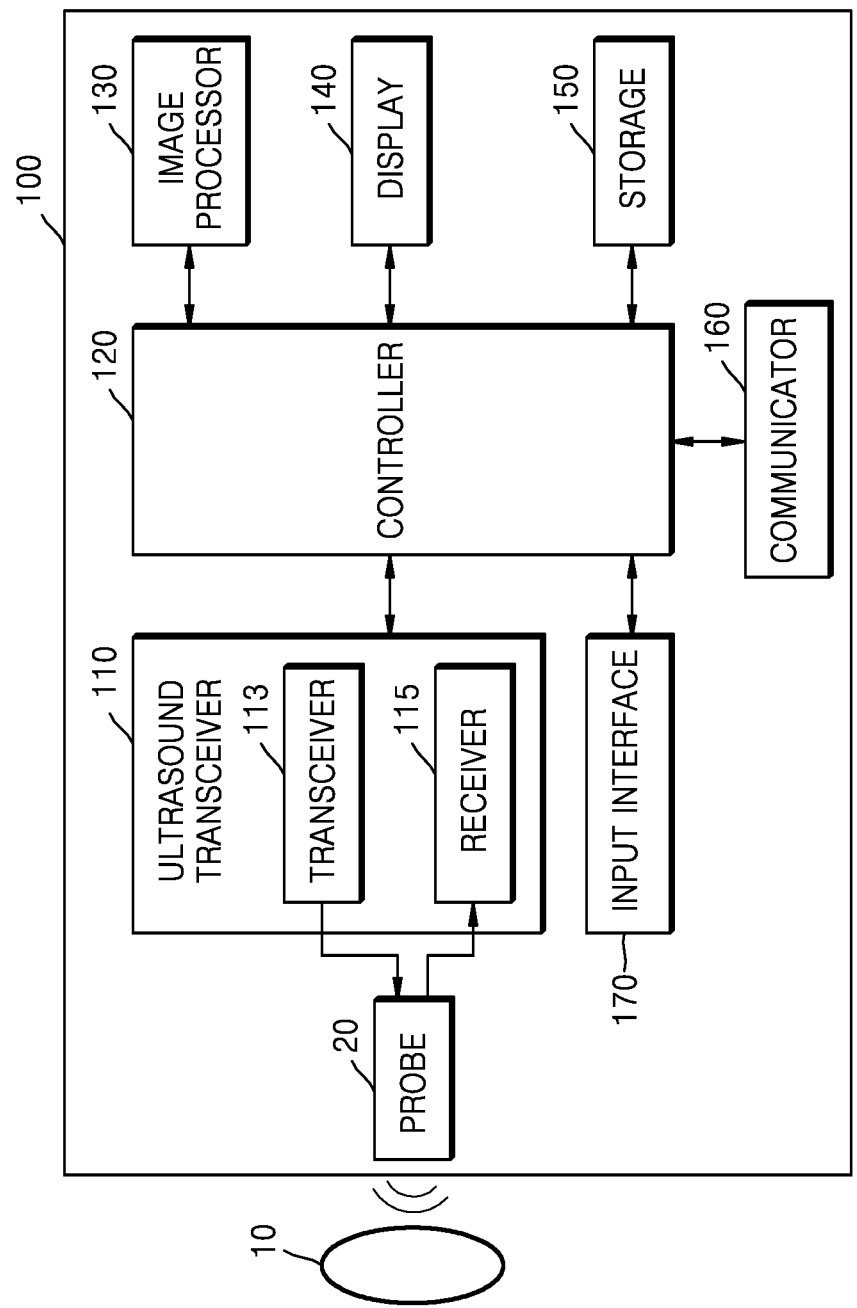
FIG. 1 is a block diagram of a configuration of an ultrasound imaging apparatus according to an embodiment.

Certain exemplary embodiments are described in greater detail below with reference to the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

Terms such as "part" and "portion" used herein denote those that may be embodied by software or hardware. According to exemplary embodiments, a plurality of parts or portions may be embodied by a single unit or element, or a single part or portion may include a plurality of elements. Expressions such as "at least one of," when preceding a list of elements, modify the entire list of elements and do not modify the individual elements of the list.

In exemplary embodiments, an image may include any medical image acquired by various medical imaging apparatuses such as a magnetic resonance imaging (MRI) apparatus, a computed tomography (CT) apparatus, an ultrasound imaging apparatus, or an X-ray apparatus.

Also, in the present specification, an "object", which is a thing to be imaged, may include a human, an animal, or a part thereof. For example, an object may include a part of a human, that is, an organ or a tissue, or a phantom.

Throughout the specification, an ultrasound image refers to an image of an object processed based on ultrasound signals transmitted to the object and reflected therefrom.

Embodiments will be described in more detail below with reference to the accompanying drawings.

FIG. 1 is a block diagram illustrating a configuration of an ultrasound imaging apparatus 100 according to an exemplary embodiment.

Referring to FIG. 1, the ultrasound imaging apparatus 100 may include a probe 20, an ultrasound transceiver 110, a controller 120, an image processor 130, one or more displays 140, a storage 150, e.g., a memory, a communicator 160, i.e., a communication device or an interface, and an input interface 170.

The ultrasound imaging apparatus 100 may be of a cart-type or a portable-type ultrasound imaging apparatus, which is portable, moveable, mobile, or hand-held. Examples of the portable-type ultrasound imaging apparatus may include a smart phone, a laptop computer, a personal digital assistant (PDA), and a tablet personal computer (PC), each of which may include a probe and a software application, but embodiments are not limited thereto.

The probe 20 may include a plurality of transducers. The plurality of transducers may transmit ultrasound signals to an object 10 in response to transmitting signals received by the probe 20, from a transmitter 113. The plurality of transducers may receive ultrasound signals reflected from the object 10 to generate reception signals. In addition, the probe 20 and the ultrasound imaging apparatus 100 may be formed in one body (e.g., disposed in a single housing), or the probe 20 and the ultrasound imaging apparatus 100 may be formed separately (e.g., disposed separately in separate housings) but linked wirelessly or via wires. In addition, the ultrasound imaging apparatus 100 may include one or more probes 20 according to embodiments.

The controller 120 may control the transmitter 113 for the transmitter 113 to generate transmitting signals to be applied to each of the plurality of transducers based on a position and a focal point of the plurality of transducers included in the probe 20.

The controller 120 may control a receiver 115 to generate ultrasound data by converting reception signals received from the probe 20 from analogue to digital signals and summing the reception signals converted into digital form, based on a position and a focal point of the plurality of transducers.

The image processor 130 may generate an ultrasound image by using ultrasound data generated from the receiver 115.

The display 140 may display a generated ultrasound image and various pieces of information processed by the ultrasound imaging apparatus 100. The ultrasound imaging apparatus 100 may include two or more displays 140 according to the present exemplary embodiment. The display 140 may include a touch screen in combination with a touch panel.

The controller 120 may control the operations of the ultrasound imaging apparatus 100 and flow of signals between the internal elements of the ultrasound imaging apparatus 100. The controller 120 may include a memory for storing a program or data to perform functions of the ultrasound imaging apparatus 100 and a processor and/or a microprocessor (not shown) for processing the program or data. For example, the controller 120 may control the operation of the ultrasound imaging apparatus 100 by receiving a control signal from the input interface 170 or an external apparatus.

The ultrasound imaging apparatus 100 may include the communicator 160 and may be connected to external apparatuses, for example, servers, medical apparatuses, and portable devices such as smart phones, tablet personal computers (PCs), wearable devices, etc., via the communicator 160.

The communicator 160 may include at least one element capable of communicating with the external apparatuses. For example, the communicator 160 may include at least one among a short-range communication module, a wired communication module, and a wireless communication module.

The communicator 160 may receive a control signal and data from an external apparatus and transmit the received control signal to the controller 120 so that the controller 120 may control the ultrasound imaging apparatus 100 in response to the received control signal.

The controller 120 may transmit a control signal to the external apparatus via the communicator 160 so that the external apparatus may be controlled in response to the control signal of the controller 120.

For example, the external apparatus connected to the ultrasound imaging apparatus 100 may process the data of the external apparatus in response to the control signal of the controller 120 received via the communicator 160.

A program for controlling the ultrasound imaging apparatus 100 may be installed in the external apparatus. The program may include command languages to perform part of operation of the controller 120 or the entire operation of the controller 120.

The program may be pre-installed in the external apparatus or may be installed by a user of the external apparatus by downloading the program from a server that provides applications. The server that provides applications may include a recording medium where the program is stored.

The storage 150 may store various data or programs for driving and controlling the ultrasound imaging apparatus 100, input and/or output ultrasound data, ultrasound images, applications, etc.

The input interface 170 may receive a user's input to control the ultrasound imaging apparatus 100 and may include a keyboard, button, keypad, mouse, trackball, jog switch, knob, a touchpad, a touch screen, a microphone, a motion input means, a biometrics input means, etc. For example, the user's input may include inputs for manipulating buttons, keypads, mice, trackballs, jog switches, or knobs, inputs for touching a touchpad or a touch screen, a voice input, a motion input, and a bioinformation input, for example, iris recognition or fingerprint recognition, but an exemplary embodiment is not limited thereto.

An example of the ultrasound imaging apparatus 100 according to the present exemplary embodiment is described below with reference to FIGS. 2A, 2B, and 2C.

Figure 2A:
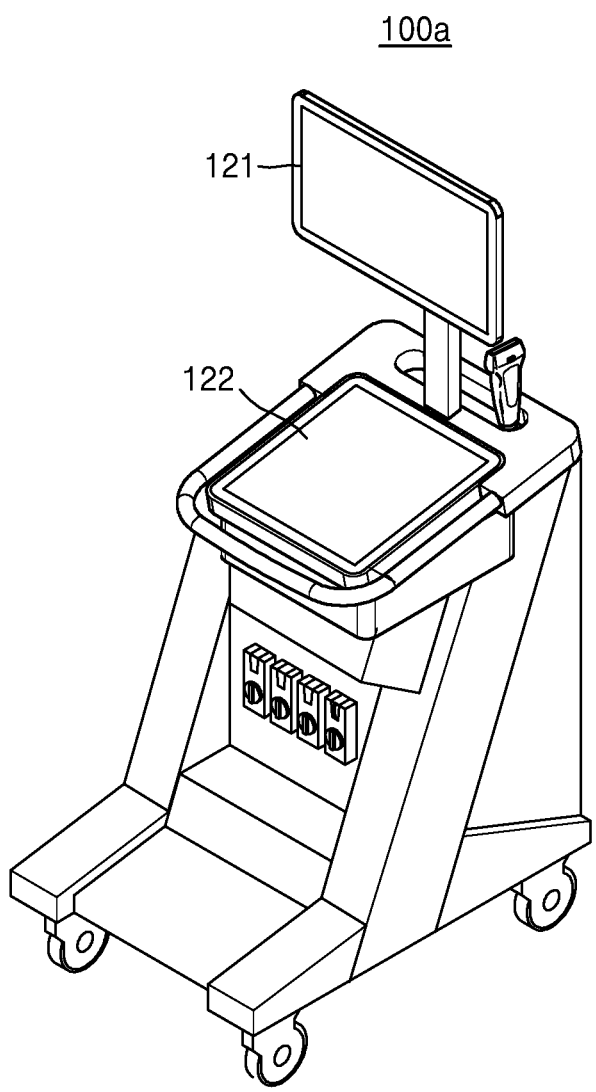
FIGS. 2A through 2C are diagrams illustrating ultrasound imaging apparatuses according to embodiments.
Figure 2B:
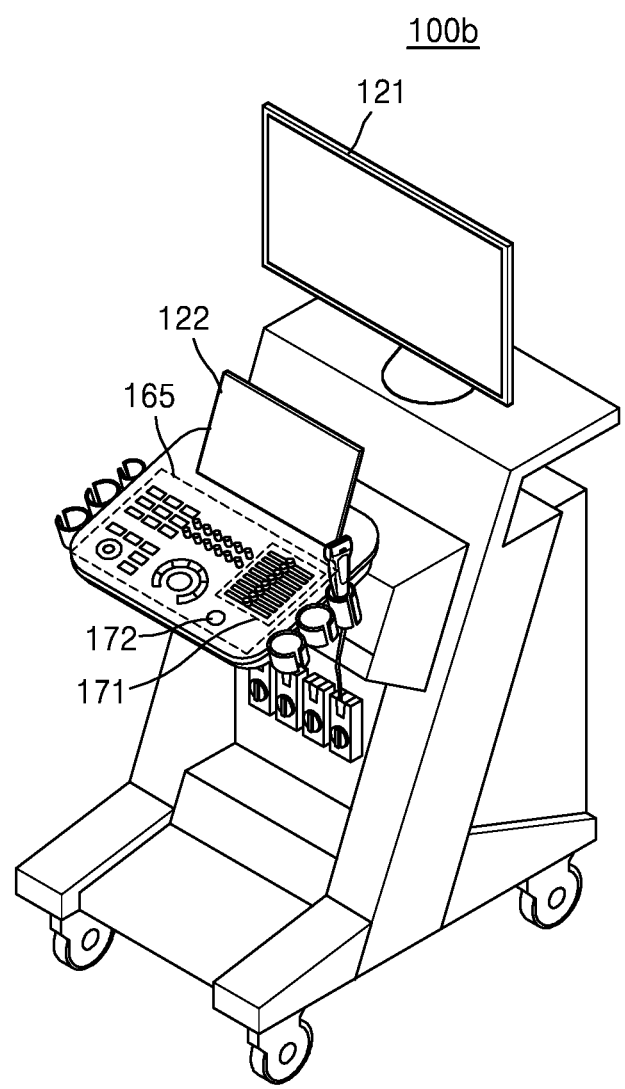
Figure 2C:
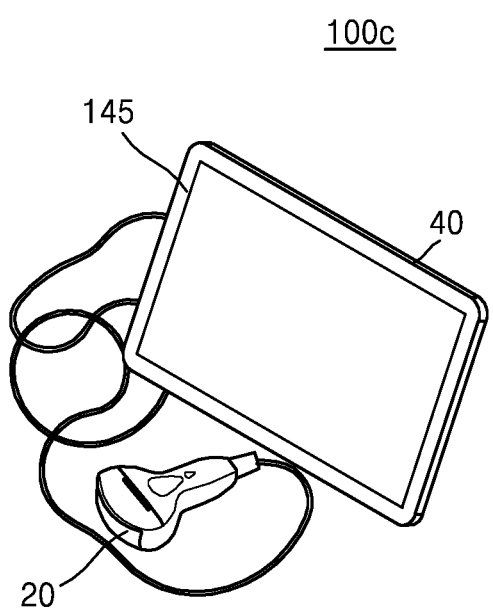

FIGS. 2A, 2B, and 2C are diagrams illustrating ultrasound imaging apparatuses 100a, 100b, and 100c according to an exemplary embodiment.

Referring to FIGS. 2A and 2B, the ultrasound imaging apparatus 100a or 100b may include a main display 121 and a sub-display 122. At least one among the main display 121 and the sub-display 122 may include a touch screen. The main display 121 and the sub-display 122 may display ultrasound images and/or various information processed by the ultrasound imaging apparatus 100a or 100b. The main display 121 and the sub-display 122 may provide graphical user interfaces (GUI), thereby receiving user's inputs of data to control the ultrasound imaging apparatus 100a or 100b. For example, the main display 121 may display an ultrasound image and the sub-display 122 may display a control panel to control display of the ultrasound image as a GUI. The sub-display 122 may receive an input of data to control the display of an image through the control panel displayed as a GUI. The ultrasound imaging apparatus 100a or 100b may control the display of the ultrasound image on the main display 121 by using the input control data.

Referring to FIG. 2B, the ultrasound imaging apparatus 100b may include a control panel 165. The control panel 165 may include buttons, trackballs, jog switches, or knobs, and may receive data to control the ultrasound imaging apparatus 100b from the user. For example, the control panel 165 may include a time gain compensation (TGC) button 171 and a freeze button 172. The TGC button 171 is to set a TGC value for each depth of an ultrasound image. Also, when an input of the freeze button 172 is detected during scanning an ultrasound image, the ultrasound imaging apparatus 100b may keep displaying a frame image at that time point.

The buttons, trackballs, jog switches, and knobs included in the control panel 165 may be provided as a GUI to the main display 121 or the sub-display 122.

Referring to FIG. 2C, the ultrasound imaging apparatus 100c may include a portable device. An example of the portable ultrasound imaging apparatus may include smart phones including probes and applications, laptop computers, personal digital assistants (PDAs), or tablet PCs, but an exemplary embodiment is not limited thereto.

The ultrasound imaging apparatus 100c may include the probe 20 and a main body 40. The probe 20 may be connected to one side of the main body 40 by wire or wirelessly. The main body 40 may include a touch screen 145. The touch screen 145 may display an ultrasound image, various pieces of information processed by the ultrasound imaging apparatus 100c, and a GUI.

Figure 3:
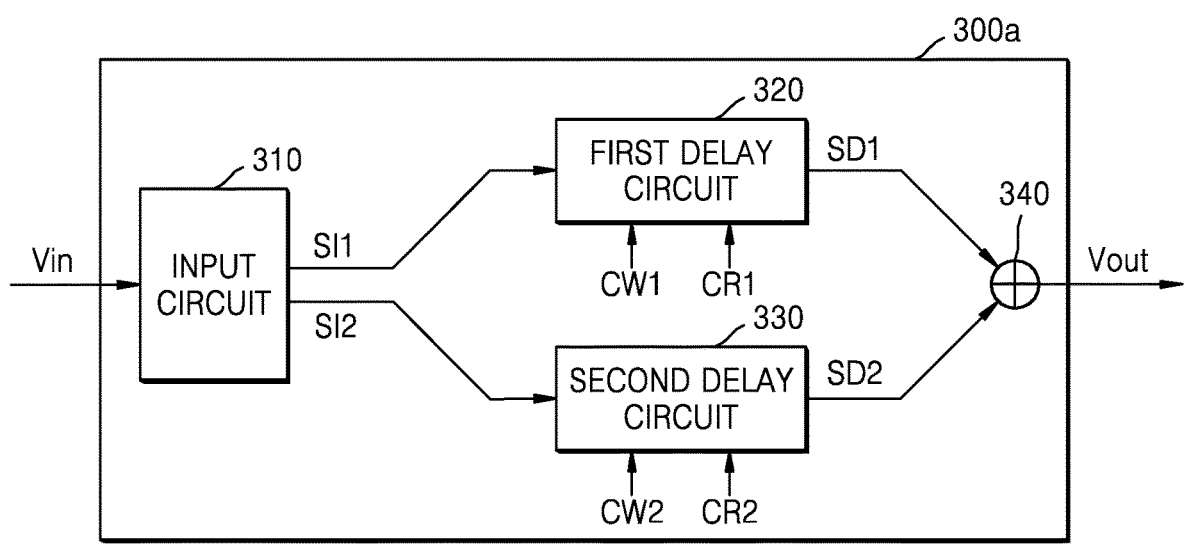
FIG. 3 illustrates a structure of an analog beamformer according to an embodiment.

FIG. 3 illustrates a structure of an analog beamformer 300a according to an embodiment.

According to embodiments, the analog beamformer 300a may be included in various electronic devices using analog signals. For example, according to embodiments, the analog beamformer 300a may be included in each of the ultrasound imaging apparatuses 100, 100a, 100b, and 100c. The analog beamformer 300a may be included in the receiver 115 of the ultrasound transceiver 110 to perform a beamforming operation on analog signals generated by the probe 20. In detail, the analog beamformer 300a may perform a beamforming operation on analog signals respectively output from a plurality of transducer elements of a transducer in the probe 20 by applying different delay times to the analog signals according to positions of the transducer elements. For example, the analog beamformer 300a may perform a beamforming operation on analog signals respectively output from an array of a plurality of transducer elements aligned in a straight line by applying a relatively long delay time to an output signal from a transducer element close to a center of the array and a relatively short delay time to an output signal from a transducer element close to edges thereof. The ultrasound imaging apparatus 100, 100a, 100b, or 100c may correct signal distortion due to a difference in a physical distance between transducer elements by performing a beamforming operation on an analog signal output from the probe 20.

According to embodiments, the analog beamformer 300a may correspond to a channel that is a propagation path of an analog signal. According to an embodiment, when analog signals propagate through a plurality of channels, a corresponding analog beamformer 300a may be provided for each of the channels. According to another embodiment, analog signal channels are divided into a plurality of groups, each group including a predetermined number of analog signal channels, and a corresponding analog beamformer 300a may be provided for each of the groups. In this case, a plurality of analog signal channels in each group may sequentially perform beamforming according to a predetermined timing by using the analog beamformer 300a. For example, in the ultrasound imaging apparatus 100, 100a, 100b, or 100c, a separate analog beamformer 300a may be provided for each of a plurality of transducer elements or each of a plurality of groups defined by dividing the transducer elements into a predetermined number of transducer elements.

According to embodiments, the analog beamformer 300a may be included in a radar. The radar emits electromagnetic waves toward an object and receives electromagnetic waves reflected from the object to acquire information about a distance, a direction, and an altitude of the object. For example, the radar may use microwaves (having a wavelength of 10 cm to 100 cm). According to an embodiment, the radar may include the analog beamformer 300a and perform beamforming on electromagnetic waves reflected from the object.

According to an embodiment, the analog beamformer 300a may be provided in a radar installed on a car. The car uses the radar to detect its surroundings. For example, the car uses the radar to detect its surrounding objects, other cars, and people. According to embodiments, the analog beamformer 300a may be provided in at least one radar for detecting objects on the front, sides, and rear of the car.

According to an embodiment, the analog beamformer 300a includes an input circuit 310, a first delay circuit 320, a second delay circuit 330, and an output circuit 340.

The input circuit 310 receives an input signal Vin to generate and output a first input signal SI1 and SI2. The first input signal SI1 has a phase difference corresponding to a first phase with respect to the second input signal SI2. For example, the first input signal SI1 may have the same phase as the input signal Vin, and the second input signal SI2 may have a phase that is delayed by the first phase with respect to a phase of the input signal Vin. The input circuit 310 may only adjust the phase of the input signal Vin while preserving a wave shape thereof. The input circuit 310 may generate first and second input signals SI1 and SI2 with the same intensity as the input signal Vin or by amplifying the input signal Vin.

According to an embodiment, the first phase may be 90 or 270 degrees.

According to an embodiment, the input circuit 310 may perform orthogonal transformation on the input signal Vin to the first and second input signals SI1 and SI2 that are orthogonal to each other.

According to an embodiment, the input circuit 310 may correspond to a resistor-capacitor (RC) quadrature signal generator having a bandwidth BW. For example, the first and second input signals SI1 and SI2 may be respectively output in the form of cosine and sine functions.

The first and second input signals SI1 and SI2 may be respectively input to the first and second delay circuits 320 and 330.

The first delay circuit 320 receives the first input signal SI1 and delays the first input signal SI1 by a beamforming delay time TD to output a first delayed signal SD1. The second delay circuit 330 receives the second input signal SI2 and delays the second input signal SI2 by the beamforming delay time TD to output a second delayed signal SD2. The first and second delay circuits 320 and 330 are driven based on a sample-and-hold principle.

A first write signal CW1 and a first read signal CR1 input to the first delay circuit 320 periodically turns on/off an analog switch included in the first delay circuit 320 to drive the first delay circuit 320. The first read signal CR1 includes a pulse that is delayed by the beamforming delay time TD with respect to the first write signal CW1. The first delay circuit 320 may delay the first input signal SI1 by the beamforming delay time TD to output the first delayed signal SD1.

A second write signal CW2 and a second read signal CR2 input to the second delay circuit 330 periodically turns on/off an analog switch in the second delay circuit 330 to drive the second delay circuit 330. The second read signal CR2 includes a pulse that is delayed by the beamforming delay time TD with respect to the second write signal CW2. The second delay circuit 330 may delay the second input signal SI2 by the beamforming delay time TD to output the second delayed signal SD2.

According to an embodiment, the first write signal CW1 has a phase difference corresponding to a first phase with respect to the second write signal CW2. For example, the second write signal CW2 may be delayed by the first phase with respect to the first write signal CW1. According to an embodiment, the first read signal CR1 has a phase difference corresponding to the first phase with respect to the second read signal CR2. For example, the second read signal CR2 may be delayed by the first phase with respect to the first read signal CR1.

The output circuit 340 sums the first and second delayed signals SD1 and SD2 to output an output signal Vout.

Figure 4:
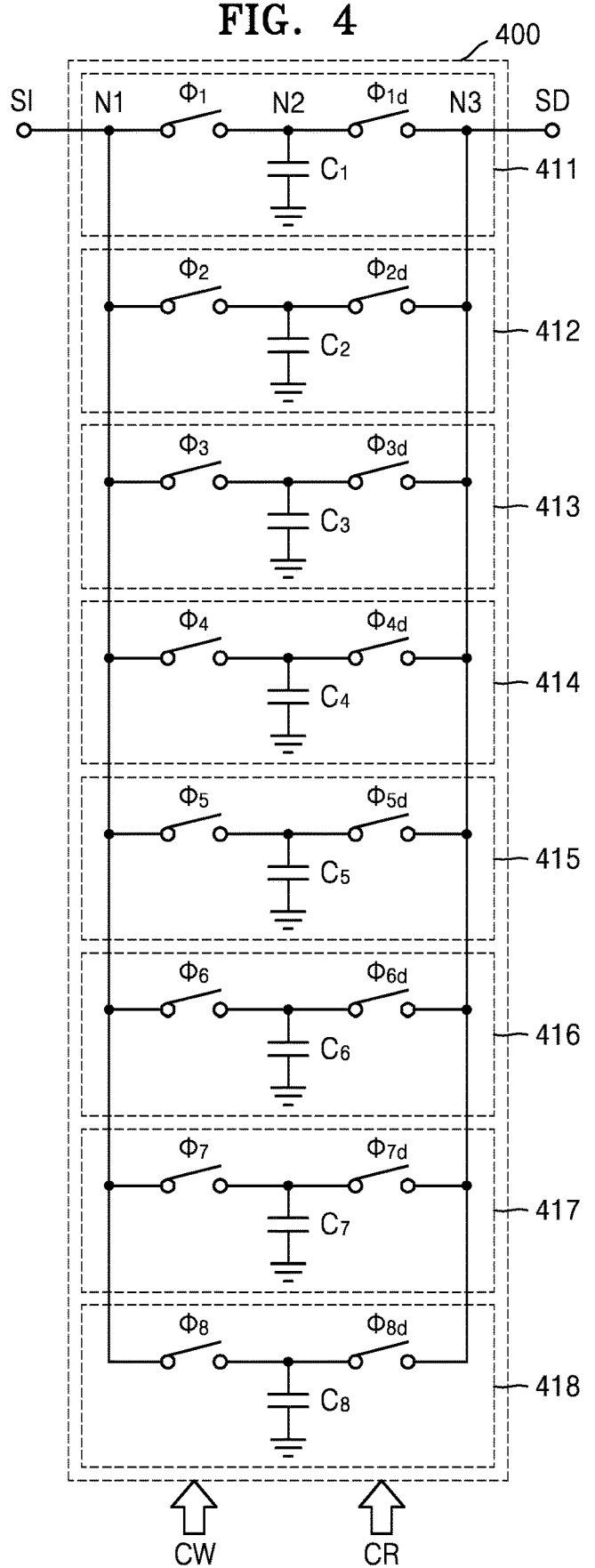
FIG. 4 illustrates a structure of a delay circuit according to an embodiment.

FIG. 4 illustrates a structure of a delay circuit 400 according to an embodiment.

The first and second delay circuits 320 and 330 may have the same structure as that of the delay circuit 400 of FIG. 4.

According to an embodiment, the delay circuit 400 receives an n-th input signal SI to output an n-th output signal SD. The delay circuit 400 includes a plurality of delay cells 411 through 418. Although FIG. 4 shows an embodiment in which the delay circuit 400 includes the eight (8) delay cells 411 through 418, the number of delay cells may vary according to embodiments. The delays cells 411 through 418 may be driven by a write signal CW and a read signal CR. The write signal CW and the read signal CR may each correspond to a set of a plurality of signals generated from a clock signal. The write signal CW includes a set of a plurality of signals, wherein the number of signals of the set corresponds to the number of delay cells 411 through 418. The set of the plurality of signals in the write signal CW respectively include pulses having a sequential timing therebetween. The read signal CR includes a set of a plurality of signals, wherein the number of signals of the set corresponds to the number of delay cells 411 through 418. The set of the plurality of signals in the read signal CR respectively include pulses having a sequential timing therebetween. The read signal CR has a delay time corresponding to a beamforming delay time TD with respect to the write signal CW corresponding to the same one of the delay cells 411 through 418 as the read signal CR.

Each of the delay cells 411 through 418 has a first node N1 at which an n-th input signal SI is received and a third node N3 at which a delayed signal is output. The first nodes N1 of the delay cells 411 through 418 are electrically the same, and the third nodes N3 of the delay cells 411 through 418 are electrically the same. Furthermore, each of the delay cells 411 through 418 has a second node N2. The second nodes N2 of the delay cells 411 through 418 are electrically different from one another.

The delay cells 411 through 418 are driven by the write signal CW and the read signal CR and perform a sample-and-hold operation of receiving a signal of a predetermined time interval from among continuously received n-th input signals SI, and holding the signal. For example, the first delay cell 411 may sample and hold an n-th input signal SI of a first time interval, the second delay cell 412 may sample and hold an n-th input signal SI of a second time interval successive to the first time interval, and the third delay cell 413 may sample and hold an n-th input signal SI of a third time interval successive to the second time interval. In this way, the delay cells 411 through 418 respectively sample and hold the continuously received n-th input signals SI and are respectively driven by the read signal CR to sequentially output the sampled-and-held signals. The sequentially output signals respectively correspond to n-th delayed signals SD.

The delay cells 411 through 418 respectively include write switches φ1 through φ8, capacitors C1 through C8, and output switches φ1d through φ8d. Each of the write switches φ1 through φ8 is connected between a first node N1 at which an n-th input signal SI is received and a second node N2, and is turned on or off by the write signal CW. When each of the write switches φ1 through φ8 is turned on by the write signal CW, an n-th input signal SI is transmitted to a corresponding one of the capacitors C1 through C8 connected to a second node N2. Each of the capacitors C1 through C8 is connected between the second node N2 and a ground node to store an n-th input signal SI received via a corresponding one of the write switches φ1 through φ8. Each of the output switches φ1d through φ8d is connected between a second node N2 and a third node N3 at which an n-th delayed signal SD is output. Each of the output switches φ1d through φ8d is turned on or off by the read signal CR, and when it is turned on by the read signal CR, an n-th input signal stored in a corresponding one of the capacitors C1 through C8 is output to a third node N3.

Figure 5:
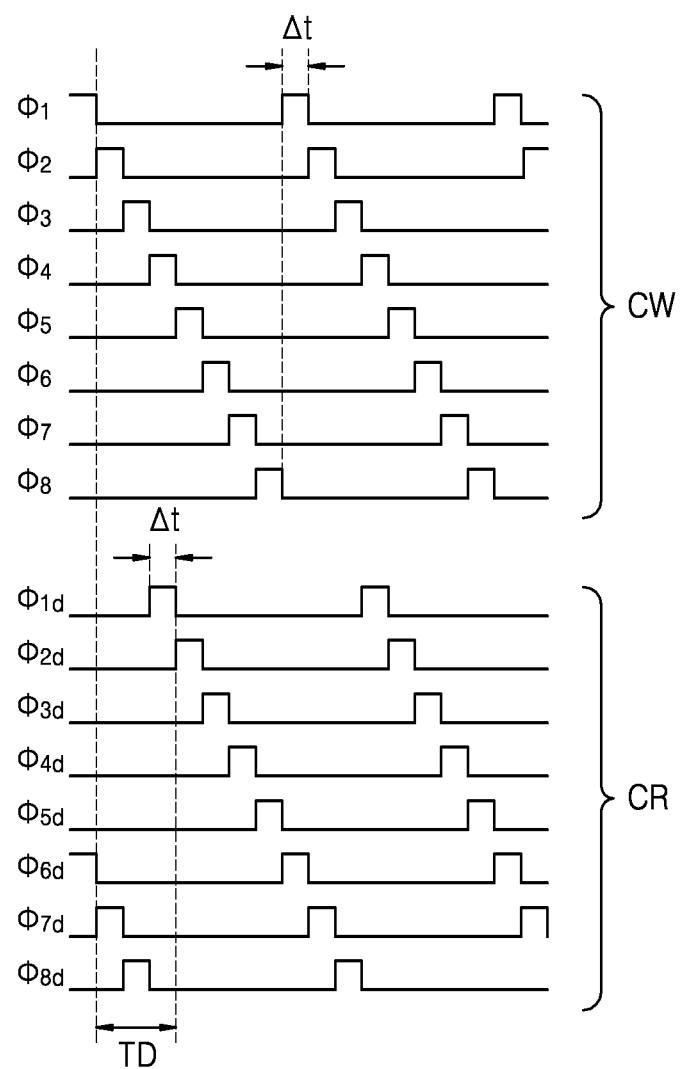
FIG. 5 illustrates a read signal and a write signal, according to an embodiment.

FIG. 5 illustrates a read signal and a write signal according to an embodiment.

According to an embodiment, the write signal CW is a set of a plurality of write pulse signals CWφ1 through CWφ8. The plurality of write pulse signals CWφ1 through CWφ8 each include a pulse having a predetermined pulse width Δt. The write pulse signals CWφ1 through CWφ8 may respectively include pulses having sequential timings in the order of their corresponding delay cells 411 through 418. Sequential timings of pulses of the write pulse signals CWφ1 through CWφ8 may be continuously repeated. The write pulse signals CWφ1 through CWφ8 may also be generated in synchronization with a predetermined clock signal.

According to an embodiment, the read signal CR is a set of a plurality of read pulse signals CRφ1d through CRφ8d. The plurality of read pulse signals CRφ1d through CRφ8d each include a pulse having a predetermined pulse width Δt. Each of the read pulse signals CRφ1d through CRφ8d has a pulse that is delayed by a beamforming delay time TD with respect to one of the write pulse signals CWφ1 through CWφ8 corresponding to the same delay cell. The read pulse signals CRφ1d through CRφ8d may respectively include pulses having sequential timings in the order of their corresponding delay cells 411 through 418. Sequential timings of pulses of the read pulse signals CRφ1d through CRφ8d may be continuously repeated. The read pulse signals CRφ1d through CRφ8d may also be generated in synchronization with a predetermined clock signal.

Figure 6:
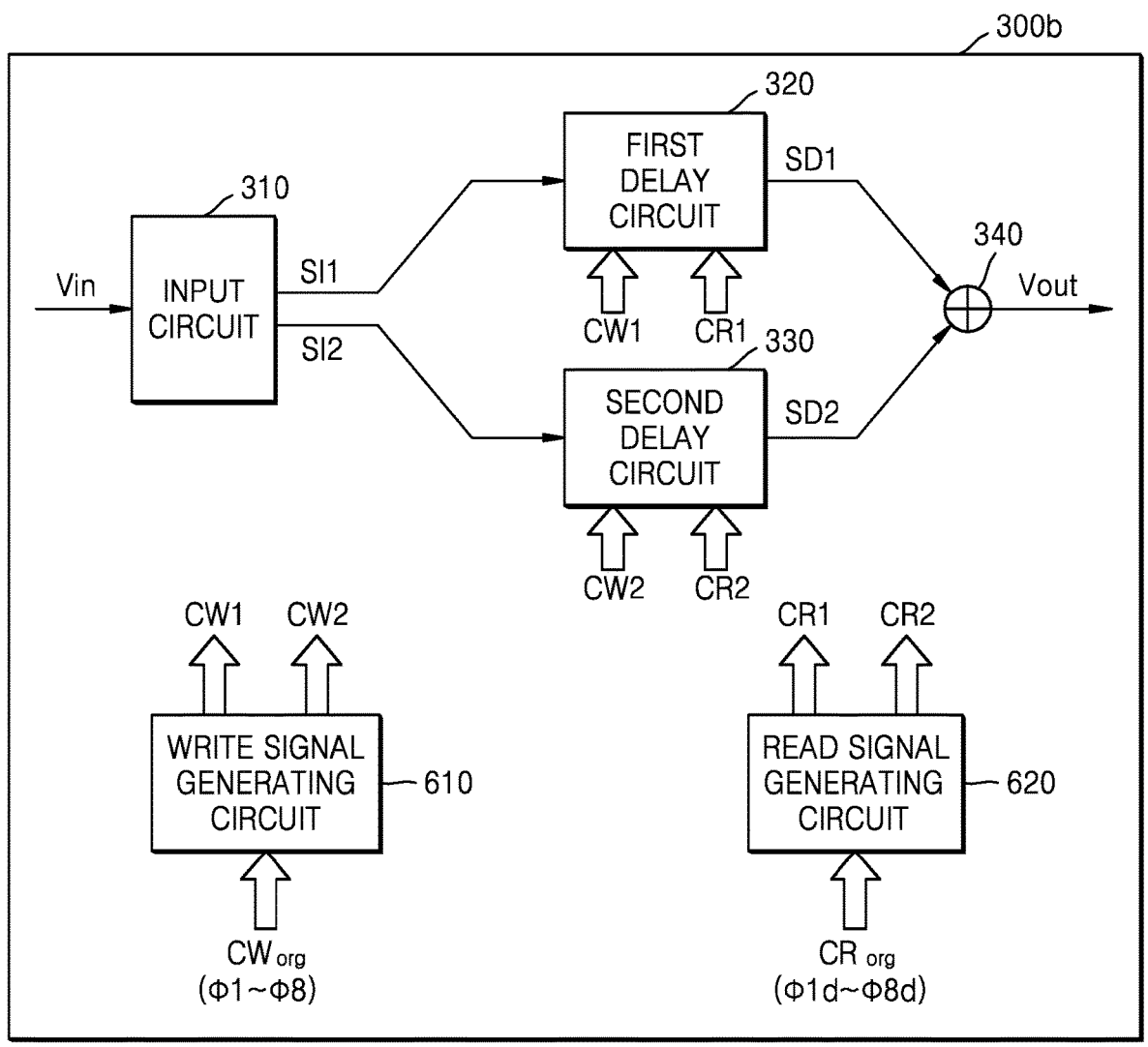
FIG. 6 illustrates a structure of an analog beamformer according to an embodiment.

FIG. 6 illustrates a structure of an analog beamformer 300b according to an embodiment.

According to an embodiment, the analog beamformer 300b may include an input circuit 310, a first delay circuit 320, a second delay circuit 330, an output circuit 340, a write signal generating circuit 610, and a read signal generating circuit 620. Because the structure and operations of the input circuit 310, the first delay circuit 320, the second delay circuit 330, and the output circuit 340 are substantially the same as those of their counterparts described with reference to FIG. 3, descriptions that are already provided above with respect to FIG. 3 will be omitted here.

The write signal generating circuit 610 receives an original write signal $CW_{org}$ to generate a first write signal CW1 and a second write signal CW2. The original write signal $CW_{org}$ may correspond to a set of a plurality of original write pulse signals respectively corresponding to the delay cells 411 through 418. The write signal generating circuit 610 may generate first and second write signals CW1 and CW2 having a phase difference corresponding to a first phase with respect to the original write signal $CW_{org}$. The first and second write signals CW1 and CW2 generated by the write signal generating circuit 610 are respectively input to the first and second delay circuits 320 and 330.

The original write signal $CW_{org}$ may correspond to a set of pulse signals, like the write signal CW shown in FIG. 5. In other words, the set of pulse signals in the original write signal $CW_{org}$ may respectively include pulses having continuous and sequential timings, each pulse having a predetermined width.

According to an embodiment, the write signal generating circuit 610 performs orthogonal transformation on the original write signal $CW_{org}$ to generate the first and second write signals CW1 and CW2 that are orthogonal to each other. For example, the write signal generating circuit 610 may correspond to a RC quadrature signal generator having a bandwidth. For example, the first and second write signals CW1 and CW2 may be respectively output in the form of cosine and sine functions.

According to another embodiment, the write signal generating circuit 610 may be a delay circuit that delays the original write signal $CW_{org}$ by 90 degrees. According to the embodiment, the second write signal CW2 corresponds to a signal that is delayed by 90 degrees with respect to the first write signal CW1.

The read signal generating circuit 620 receives an original write signal $CR_{org}$ to generate a first read signal CR1 and a second read signal CR2. The original read signal $CR_{org}$ may correspond to a set of a plurality of original read pulse signals respectively corresponding to the delay cells 411 through 418. The original read signal $CR_{org}$ includes a pulse that is delayed by a beamforming delay time TD with respect to the original write signal $CW_{org}$. The read signal generating circuit 620 may generate first and second read signals CR1 and CR2 having a phase difference corresponding to a first phase with respect to the original read signal $CR_{org}$. The first and second read signals CR1 and CR2 generated by the read signal generating circuit 620 are respectively input to the first and second delay circuits 320 and 330.

The original read signal $CR_{org}$ may correspond to a set of pulse signals such as the read signal CR shown in FIG. 5. In other words, the set of pulse signals in the original read signal $CR_{org}$ may respectively include pulses having continuous and sequential timings, each pulse having a predetermined width.

According to an embodiment, the read signal generating circuit 620 performs orthogonal transformation on the original read signal $CR_{org}$ to generate the first and second read signals CR1 and CR2 that are orthogonal to each other. For example, the read signal generating circuit 620 may correspond to a RC quadrature signal generator having a bandwidth. For example, the first and second read signals CR1 and CR2 may be respectively output in the form of cosine and sine functions.

According to another embodiment, the read signal generating circuit 620 may be a delay circuit that delays the original write signal $CR_{org}$ by 90 degrees. According to the embodiment, the second read signal CR2 corresponds to a signal that is delayed by 90 degrees with respect to the first read signal CR1.

Figure 7:
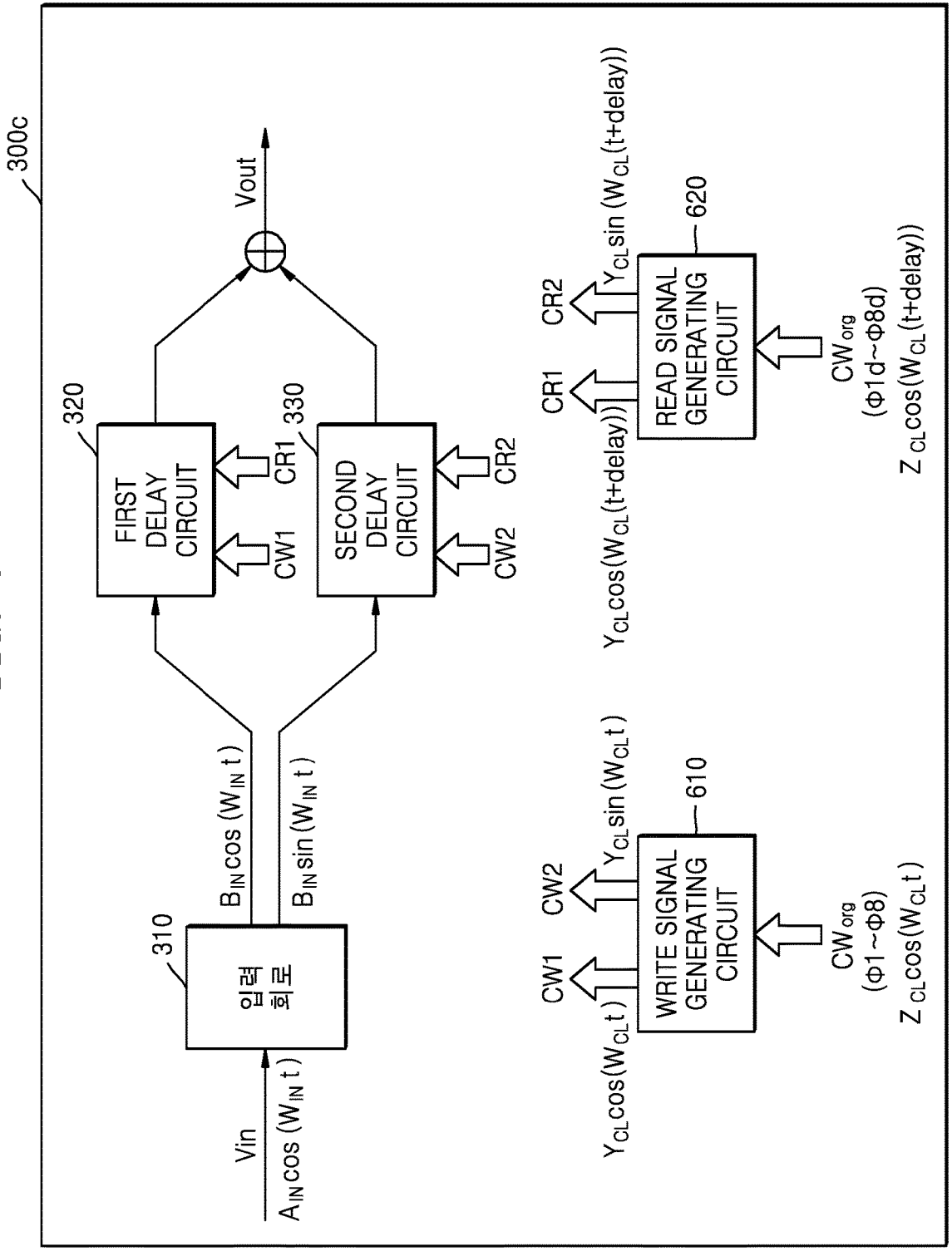
FIG. 7 illustrates a structure of an analog beamformer according to an embodiment.

FIG. 7 illustrates a structure of an analog beamformer 300c according to an embodiment.

According to an embodiment, the analog beamformer 300c may include an input circuit 310, a first delay circuit 320, a second delay circuit 330, an output circuit 340, a write signal generating circuit 610, and a read signal generating circuit 620. Because the structure and operations of the input circuit 310, the first delay circuit 320, the second delay circuit 330, and the output circuit 340 are substantially the same as those of their counterparts described with reference to FIG. 3, descriptions that are already provided above with respect to FIG. 3 will be omitted here.

According to an embodiment, to use a complex signal including an in-phase signal and a quadrature signal, the analog beamformer 300c may use a quadrature signal generator having a bandwidth in the input circuit 310, the write signal generating circuit 610, and the read signal generating circuit 620. The analog beamformer 300c separates an in-phase signal path from a quadrature signal path. The first and second delay circuits 320 and 330 are respectively provided in the in-phase and quadrature signal paths. Furthermore, the write signal generating circuit 610 generates a first write signal CW1 for the in-phase signal path and outputs the first write signal CW1 to the first delay circuit 320. The write signal generating circuit 610 also generates a second write signal CW2 for the quadrature signal path and outputs the second write signal CW2 to the second delay circuit 330. The read signal generating circuit 620 generates a first read signal CR1 for the in-phase signal path and outputs the same to the first delay circuit 320. The read signal generating circuit 620 also generates a second read signal CR2 for the quadrature signal path and outputs the same to the second delay circuit 330.

According to an embodiment, an input signal Vin may have a value of $A_{IN} \cos(W_{IN} t)$ a first input signal SI1 may have a value of $B_{IN} \cos(W_{IN} t)$, and a second input signal SI2 may have a value of $B_{IN} \sin(W_{IN} t)$. The input circuit 310 may perform orthogonal transformation on the input signal Vin of $A_{IN} \cos(W_{IN} t)$ to generate the first and second input signals SI1 and SI2. The input signal Vin has a form of a cosine function, $A_{IN}$ and $W_{IN}$ respectively denote an amplitude and a frequency of the input signal Vin, and t is the time. The first input signal SI1 has a form of a cosine function, and $B_{IN}$ denotes an amplitude of the first input signal SI1. The second input signal SI2 has a form of a sine function, and the amplitude $A_{IN}$ may be equal to or greater than the amplitude $B_{IN}$.

According to an embodiment, an original write signal $CW_{org}$ may have a value of $Z_{CL} \cos(W_{CL} t)$, the first write signal CW1 may have a value of $Y_{CL} \cos(W_{CL} t)$, and the second write signal CW2 may have a value of $Y_{CL} \sin(W_{CL} t)$. The write signal generating circuit 610 may perform orthogonal transformation on the original write signal $CW_{org}$ of $Z_{CL} \cos(W_{CL} t)$ to generate the first and second write signals CW1 and CW2. The original write signal $CW_{org}$ has a form of a cosine function, $Z_{CL}$ and $W_{CL}$ respectively denote an amplitude and a frequency of the original write signal $CW_{org}$, and t is the time. The original write signal $CW_{org}$ may be a set of pulse signals generated in synchronization with a clock signal, and $W_{CL}$ may be a frequency of the clock signal. The first write signal CW1 has a form of a cosine function, and $Y_{CL}$ denotes an amplitude of the first write signal CW1. The second write signal CW2 has a form of a sine function, and the amplitude $Z_{CL}$ may be equal to or greater than the amplitude $Y_{CL}$.

According to an embodiment, an original read signal $CR_{org}$ may have a value of $Z_{CL} \cos(W_{CL}(t+delay))$, the first read signal CR1 may have a value of $Y_{CL} \cos(W_{CL}(t+delay))$ and the second read signal CR2 may have a value of $Y_{CL} \sin(W_{CL}(t+delay))$. The original read signal $CR_{org}$ may correspond to a cosine function, and the first and second read signals CR1 and CR2 may respectively correspond to cosine and sine functions. A parameter "delay" within the cosine and sine functions may correspond to a beamforming delay time TD.

Although an ideal output signal Vout from the analog beamformer 300c of FIG. 7 has only a value corresponding to an input signal Vin fed to the analog beamformer 300c, an actual output signal Vout from the analog beamformer 300c contains unwanted mixed signal components. Mixed signal components detected in the output signal Vout (Mixed signal at Vout port) may have a value defined by Equation (1) below:

$$\text{Mixed signal at Vout port} =$$
$$B_{IN}\cos(W_{IN}t) \times Y_{CL}\sin(W_{CL}t) + B_{IN}\sin(W_{IN}t) \times Y_{CL}\cos(W_{CL}t) =$$
$$+0.5 \times B_{IN} \times Y_{CL} \times \{\sin(W_{IN}t + W_{CL}t) - \sin(W_{IN}t - W_{CL}t)\}$$
$$0.5 \times B_{IN} \times Y_{CL} \times \{\sin(W_{IN}t + W_{CL}t) + \sin(W_{IN}t - W_{CL}t)\} =$$
$$B_{IN} \times Y_{CL} \times \sin(W_{IN}t + W_{CL}t)$$

The mixed signal components include an up-mixing component that is a frequency component corresponding to a sum of a frequency $W_{IN}$ of an input signal and a frequency $W_{CL}$ of a write signal/read signal ($W_{IN}+W_{CL}$), and a down-mixing component that is a frequency component corresponding to a difference between the frequency $W_{IN}$ of the input signal and the frequency $W_{CL}$ of the write signal/read signal. According to an embodiment of the disclosure, by processing the input signal Vin through an in-phase signal path and a quadrature signal path and summing the processed signals, it is possible to remove a down-mixing component from mixed signal components in the output signal Vout. Referring to Equation (1), it can be seen that only the up-mixing component remains in the mixed signal components of the output signal Vout.

A down-mixing component of the mixed signal components has a frequency located between frequencies of an input signal Vin and a clock signal used to generate a write signal/read signal. Thus, because the down-mixing component is in a frequency range close to that of a component of the input signal Vin, it is difficult to filter only the component of the input signal Vin. Furthermore, due to their similar frequency ranges, the component of the input signal Vin is more likely to interfere with the down-mixing component. Furthermore, there is a need to lower a frequency of a clock signal for reducing power consumption of an electronic device. When the frequency of the clock signal is lowered, the frequency of the clock signal approaches the frequency of the down-mixing component, which may cause interference between the clock signal and the down-mixing component. The down-mixing component needs to be removed because it may hamper lowering of the frequency of the clock signal. According to embodiments of the disclosure, by removing a down-mixing component from mixed signal components, it is possible to increase degrees of freedom in a design of an analog beamformer circuit and improve the quality of an output signal.

Figure 8:
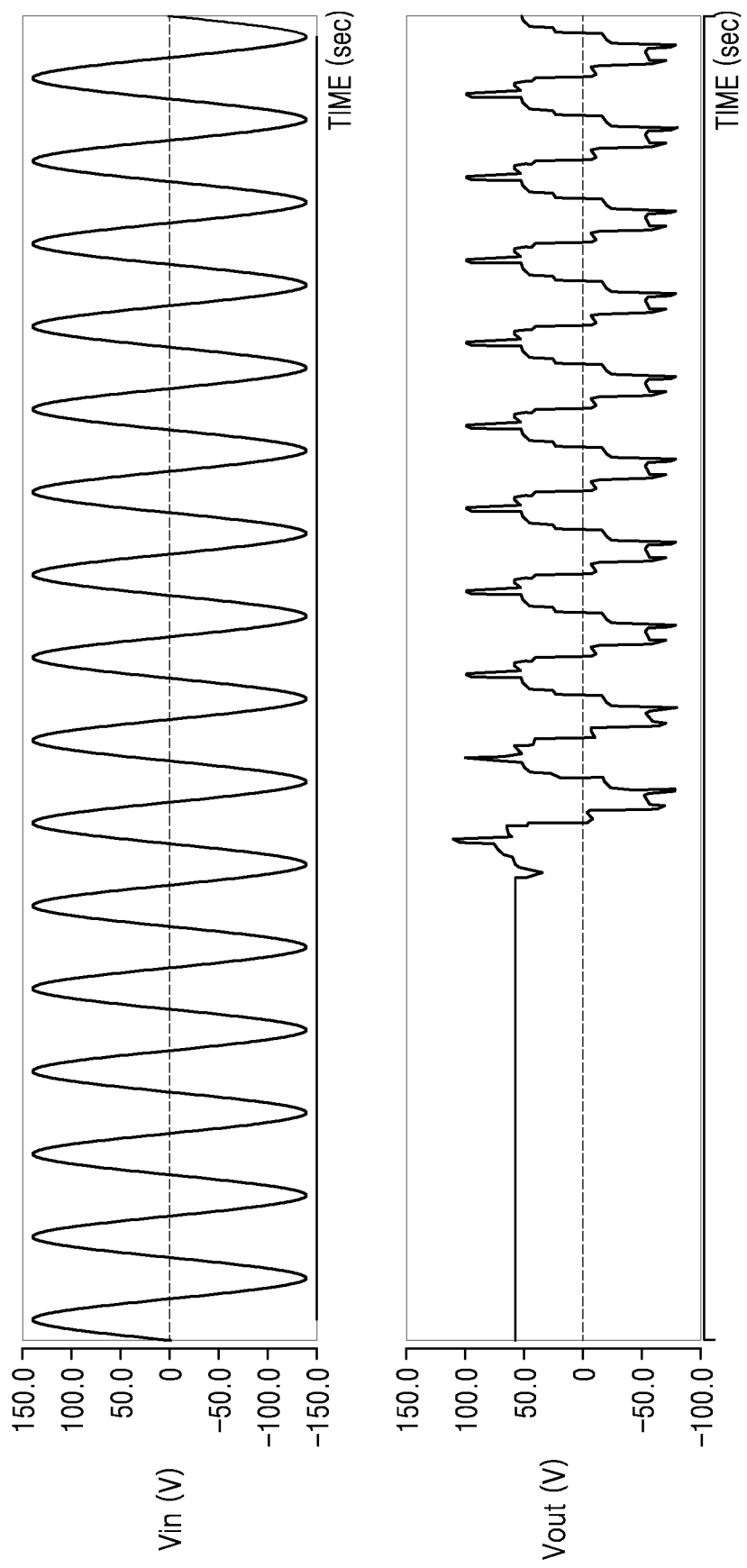
FIG. 8 illustrates waveforms of an input signal and an output signal, according to an embodiment.

FIG. 8 illustrates waveforms of an input signal and an output signal according to an embodiment.

Figure 9:
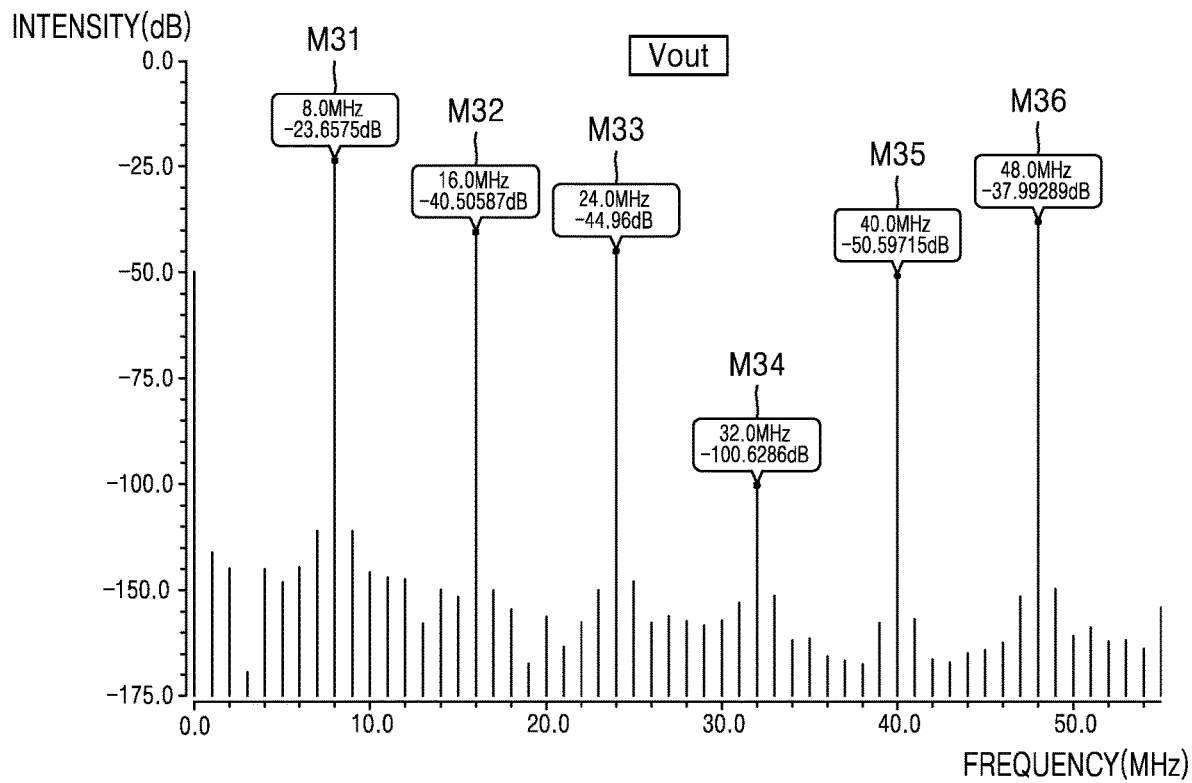
FIG. 9 illustrates an output signal that is decomposed into frequency components by performing a Fourier Transform, according to an embodiment.

FIG. 9 illustrates an output signal that is decomposed into frequency components by performing a Fourier Transform, according to an embodiment.

Figure 10:
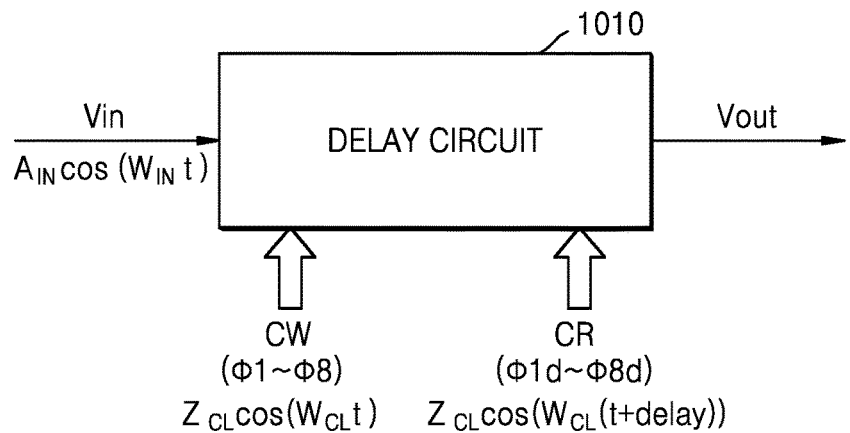
FIG. 10 illustrates a structure of an analog beamformer according to a comparative example.

FIG. 10 illustrates a structure of an analog beamformer according to a comparative example.

Figure 11:
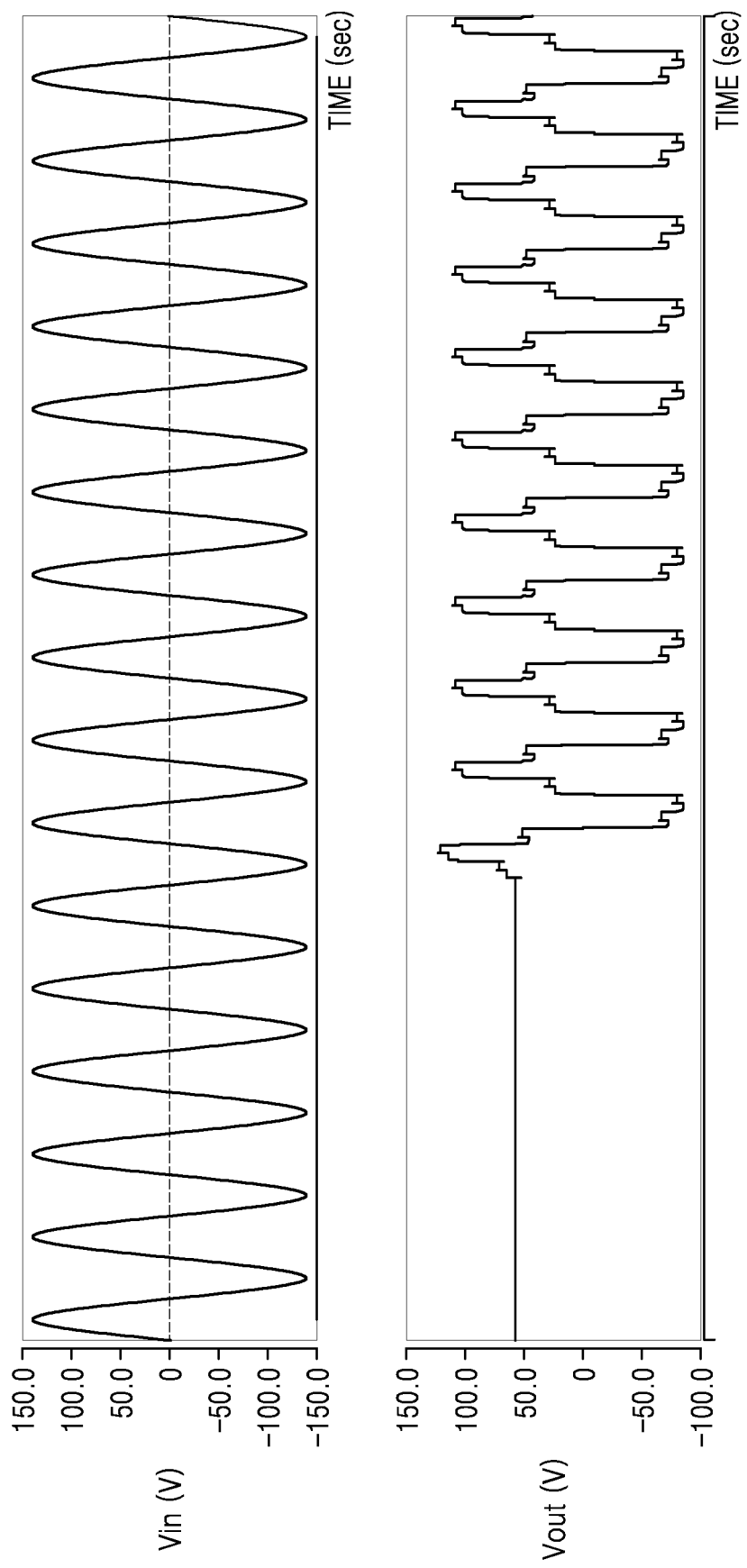
FIG. 11 illustrates waveforms of an input signal and an output signal, according to a comparative example.

FIG. 11 illustrates waveforms of an input signal and an output signal, according to a comparative example.

Figure 12:
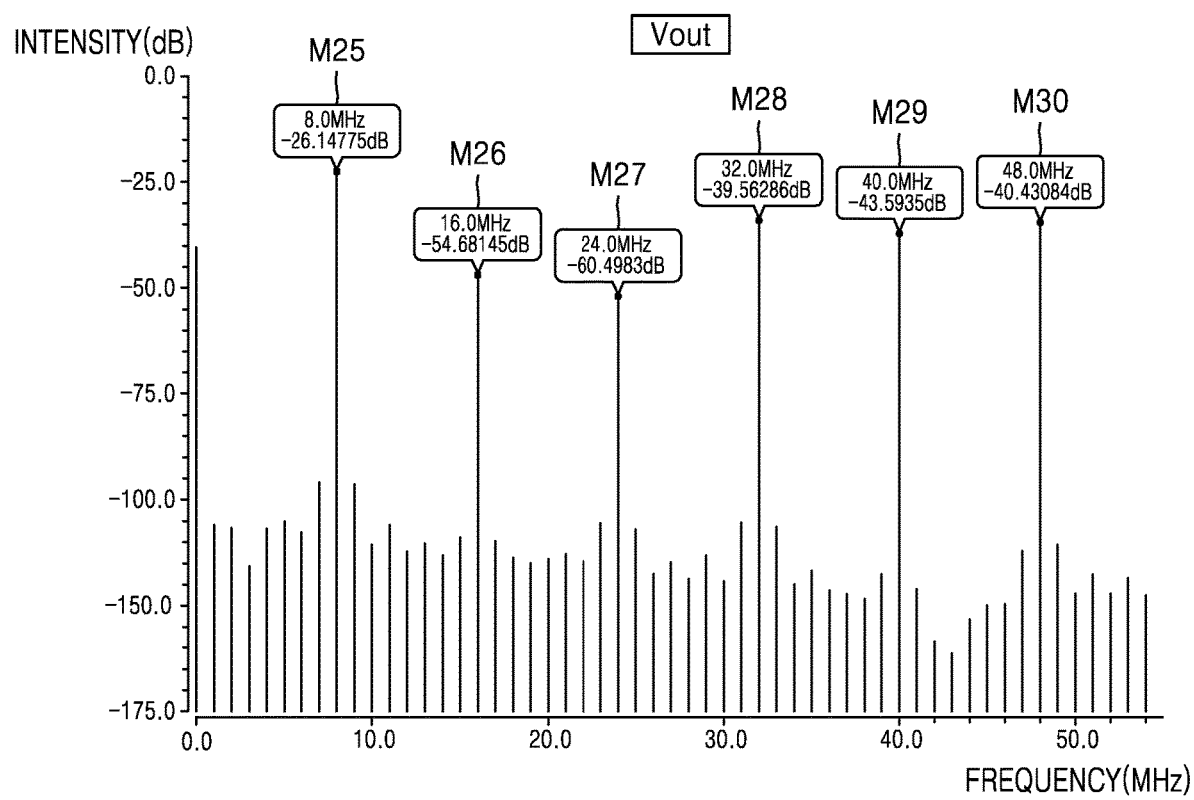
FIG. 12 illustrates an output signal that is decomposed into frequency components by performing a Fourier Transform, according to a comparative example.

FIG. 12 illustrates an output signal that is decomposed into frequency components by performing a Fourier Transform, according to a comparative example.

Frequency components of an output signal Vout from an analog beamformer according to an embodiment are now compared with frequency components of an output signal from an analog beamformer according to a comparative example. For this comparison, it is assumed that a frequency of an input signal Vin is 8 MHz, a frequency of a clock signal used to generate write and read signals is 40 MHz, and a beamforming delay time is 700 nanoseconds (ns).

The analog beamformer according to the comparative example includes a delay circuit 1010. An input signal Vin fed to the delay circuit 1010 has a value of $A_{IN} \cos(W_{IN} t)$, a write signal CW has a value of $Z_{CL} \cos(W_{CL} t)$, and a read signal CR has a value of $Z_{CL} \cos(W_{CL}(t+\text{delay}))$. According to the comparative example, the delay circuit 1010 receives an input signal Vin as shown in FIG. 11 to output an output signal Vout that is delayed by a predetermined beamforming delay time. FIG. 12 illustrates an output signal Vout that is decomposed into frequency components by performing a Fourier Transform on an output signal Vout of FIG. 11. As seen in the output signal Vout of FIG. 12, a plurality of frequency components are observed, and in particular, components having high intensities, such as M25, M26, M27, M28, M29, and M30, are observed. In this case, M25 and M29 respectively correspond to an input signal component of 8 MHz and a clock signal component of 40 MHz, and M28 and M30 respectively correspond to a down-mixing component of 32 MHz and an up-mixing component of 48 MHz. As seen on FIG. 12, according to the comparative example, an observed down-mixing component has an intensity similar to those of the clock signal and the input signal Vin.

An analog beamformer according to an embodiment receives an input signal Vin as shown in FIG. 8 to output an output signal Vout that is delayed by a predetermined beamforming delay time. FIG. 9 illustrates an output signal Vout that is decomposed into frequency components by performing a Fourier Transform on an output signal Vout of FIG. 8. As seen in the output signal Vout of FIG. 9, a plurality of frequency components are observed, and in particular, components having high intensities, such as M31, M32, M33, M34, M35, and M36, are observed. In this case, M31 and M35 respectively correspond to an input signal component of 8 MHz and a clock signal component of 40 MHz, and M34 and M36 respectively correspond to a down-mixing component of 32 MHz and an up-mixing component of 48 MHz. It can be observed that an intensity of the down-mixing component in the output signal Vout according to the embodiment is significantly reduced to −100 dB from −39.6 dB that is an intensity of the down-mixing component according to the comparative example.

According to embodiments, undesired signal components may be reduced in an output signal from an analog beamformer.

Furthermore, according to embodiments, down-mixing components may be reduced in an output signal from an analog beamformer.

While embodiments of the disclosure have been particularly shown and described with reference to the accompanying drawings, it will be understood by those of ordinary skill in the art that various changes in form and details may be made therein without departing from essential characteristics or the spirit and scope of the disclosure as defined by the appended claims. The disclosed embodiments should be considered in a descriptive sense only and not for purposes of limitation.

What is claimed is:

1. An analog beamformer comprising a plurality of channels, each of the plurality of channels comprising:
   an input circuit configured to receive an input signal to generate a first input signal having the same phase as the input signal and a second input signal having a phase difference corresponding to a first phase with respect to the input signal;
   a first delay circuit configured to receive the first input signal and delay the first input signal by a beamforming delay time to output a first delayed signal;
   a second delay circuit configured to receive the second input signal and delay the second input signal by the beamforming delay time to output a second delayed signal; and
   an output circuit configured to output an output signal by summing the first delayed signal and the second delayed signal,
      wherein a first write signal controlling an input of the first delay circuit has a phase difference corresponding to the first phase with respect to a second write signal controlling an input of the second delay circuit, and a first read signal controlling an output of the first delay circuit has a phase difference corresponding to the first phase with respect to a second read signal controlling an output of the second delay circuit,
   wherein a first channel receiving a third input signal as the input signal from a first transducer element, among the plurality of channels, applies a first beamforming delay time as the beamforming delay time, and
   wherein a second channel receiving a fourth input signal as the input signal from a second transducer element positioned farther from a center of transducer elements compared to the first transducer element, among the plurality of channels, applies a second beamforming delay time shorter than the first beamforming delay time as the beamforming delay time.

2. The analog beamformer of claim 1, wherein the first phase corresponds to 90 degrees.

3. The analog beamformer of claim 1, wherein the input circuit is further configured to perform orthogonal transformation on the input signal, and
wherein the first input signal is orthogonal to the second input signal.

4. The analog beamformer of claim 1, wherein the first delay circuit is further configured to hold the first input signal in response to the first write signal and output the first delayed signal in response to the first read signal that is delayed by the beamforming delay time with respect to the first write signal,
wherein the second delay circuit is further configured to hold the second input signal in response to the second write signal and output the second delayed signal in response to the second read signal that is delayed by the beamforming delay time with respect to the second write signal, and
wherein the second write signal has the phase difference corresponding to the first phase with respect to the first write signal, and the second read signal has the phase difference corresponding to the first phase with respect to the first read signal.

5. The analog beamformer of claim 4, further comprising:
a write signal generating circuit configured to generate the first write signal and the second write signal by performing orthogonal transformation on an original write signal; and
a read signal generating circuit configured to generate the first read signal and the second read signal by performing orthogonal transformation on an original read signal.

6. The analog beamformer of claim 4, wherein the first delay circuit comprises a plurality of first delay cells, each of the plurality of first delay cells comprising:
a first write switch that is turned on in response to the first write signal and transmits the first input signal;
a first capacitor storing the first input signal transmitted via the first write switch; and
a first output switch that is turned on in response to the first read signal and outputs the first delayed signal from the first capacitor, and
wherein the second delay circuit comprises a plurality of second delay cells, each of the plurality of second delay cells comprising:

a second write switch that is turned on in response to the second write signal and transmits the second input signal;
a second capacitor storing the second input signal transmitted via the second write switch; and
a second output switch that is turned on in response to the second read signal and outputs the second delayed signal from the second capacitor.

7. The analog beamformer of claim 6, wherein the first write signal comprises a plurality of pulses respectively corresponding to the plurality of first delay cells, and the first read signal comprises a plurality of pulses respectively corresponding to the plurality of first delay cells, and
wherein the second write signal comprises a plurality of pulses respectively corresponding to the plurality of second delay cells, and the second read signal comprises a plurality of pulses respectively corresponding to the plurality of second delay cells.

8. The analog beamformer of claim 1, wherein each of the first write signal and the second write signal has a first clock frequency, and
wherein the output signal comprises an up-mixing component having a frequency corresponding to a sum of an input frequency of the input signal and the first clock frequency, and comprises a down-mixing component having a frequency corresponding to a difference between the input frequency and the first clock frequency.

9. The analog beamformer of claim 8, wherein an intensity of the down-mixing component is less than or equal to ten (10) percent of an intensity of the up-mixing component.

10. The analog beamformer of claim 1, wherein the analog beamformer is configured to perform beamforming on an analog signal output from an ultrasound probe, and
wherein the input signal comprises a plurality of signals output from a plurality of elements of a transducer in the ultrasound probe.

11. The analog beamformer of claim 1, wherein the analog beamformer is configured to perform beamforming on an analog signal detected by a radar, and
wherein the input signal comprises a plurality of signals output from a plurality of detecting elements of the radar.

12. The analog beamformer of claim 11, wherein the radar is installed on a car to detect objects in the car's surroundings.

* * * * *